United States Patent
Balasubramanian et al.

(10) Patent No.: US 11,722,126 B2
(45) Date of Patent: Aug. 8, 2023

(54) STABLE LEVEL SHIFTERS IN HIGH SLEW RATE OR NOISY ENVIRONMENTS

(71) Applicant: TEXAS INSTRUMENTS INCORPORATED, Dallas, TX (US)

(72) Inventors: Shyamsunder Balasubramanian, Plano, TX (US); Michael Edwin Butenhoff, Minnesota City, MN (US); Toshio Yamanaka, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/463,001

(22) Filed: Aug. 31, 2021

(65) Prior Publication Data
US 2023/0067055 A1   Mar. 2, 2023

(51) Int. Cl.
*H03K 3/013* (2006.01)
*H03K 3/356* (2006.01)
*H03K 3/012* (2006.01)
*H02K 11/33* (2016.01)

(52) U.S. Cl.
CPC ............ *H03K 3/013* (2013.01); *H03K 3/012* (2013.01); *H03K 3/356* (2013.01); *H02K 11/33* (2016.01)

(58) Field of Classification Search
CPC ......... H03K 3/012; H03K 3/013; H03K 3/356
See application file for complete search history.

(56) References Cited

U.S. PATENT DOCUMENTS

| | | | |
|---|---|---|---|
| 9,979,397 B1* | 5/2018 | Zhu | H03K 5/19 |
| 2011/0248751 A1* | 10/2011 | Sinow | H03K 17/6871 327/109 |
| 2015/0210071 A1* | 7/2015 | Van Brocklin | B41J 2/0452 347/10 |
| 2015/0263674 A1* | 9/2015 | Pulijala | H03F 3/211 330/295 |
| 2021/0409010 A1* | 12/2021 | Javvaji | H03K 19/018521 |

* cited by examiner

*Primary Examiner* — Sibin Chen
(74) *Attorney, Agent, or Firm* — Valerie M. Davis; Frank D. Cimino

(57) ABSTRACT

A system includes a level shifter coupled to a voltage source, a first transistor, and a second transistor. The system also includes a first current source coupled to the first transistor and the second transistor and configured to bias the first transistor and the second transistor. The system includes a slew detector coupled to the voltage source and to the first current source, where the slew detector is configured to detect a change in voltage of the voltage source, and further configured to provide current to the first current source responsive to detecting the change. The system also includes a second current source coupled in parallel to the first current source, where the second current source is configured to provide current to the first current source responsive to a control signal.

20 Claims, 6 Drawing Sheets

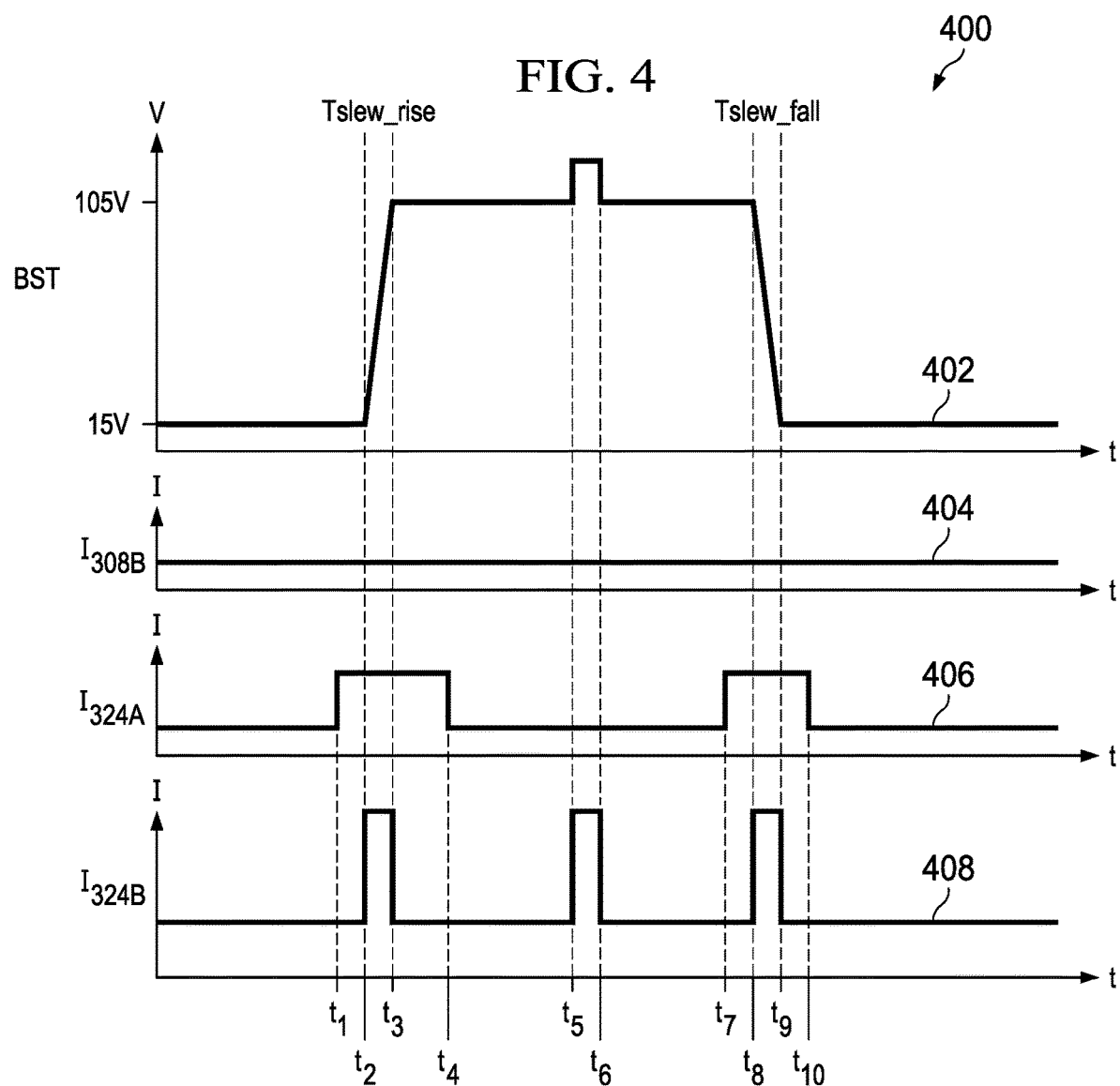

STABLE LEVEL SHIFTERS IN HIGH SLEW RATE OR NOISY ENVIRONMENTS

BACKGROUND

A motor driver acts as an interface between a motor and control circuitry. Many motor drivers have high voltage level shifters, which translate signals from one voltage level to another. The level shifters may be coupled to a high voltage rail (e.g., a conductor connected to a high voltage supply) with a high slew rate. The slew rate (or "slew") quantifies the transition from one voltage level to another voltage level and is, therefore, expressed as the change in voltage per unit of time during this transition. Some slew rates for motor driver circuitry may be higher than one volt per nanosecond.

SUMMARY

In accordance with at least one example of the description, a system includes a level shifter coupled to a voltage source, a first transistor, and a second transistor. The system also includes a first current source coupled to the first transistor and the second transistor. The system includes a slew detector coupled to the voltage source and to the first current source. The system also includes a second current source coupled in parallel to the first current source.

In accordance with at least one example of the description, a method includes driving a first transistor and a second transistor with a level shifter. The method also includes biasing the first transistor and the second transistor with a bias current. The method includes detecting a slew of a voltage source. The method also includes responsive to determining that the slew exceeds a threshold, increasing the bias current.

In accordance with at least one example of the description, a system includes a level shifter coupled to a voltage source, a first transistor, and a second transistor. The system also includes a first current source coupled to the first transistor and the second transistor and configured to bias the first transistor and the second transistor. The system includes a slew detector coupled to the voltage source and to the first current source, where the slew detector is configured to detect a change in voltage of the voltage source, and further configured to provide current to the first current source responsive to detecting the change. The system also includes a second current source coupled in parallel to the first current source, where the second current source is configured to provide current to the first current source responsive to a control signal.

BRIEF DESCRIPTION OF THE DRAWINGS

FIG. 4 is a collection of timing diagrams for a level shifter in accordance with various examples.

The same reference numbers or other reference designators are used in the drawings to designate the same or similar (functionally and/or structurally) features.

DETAILED DESCRIPTION

In a motor driver integrated circuit (IC), many level shifters operate from a fast slewing high-voltage rail (e.g., high-voltage source). Due to power consumption requirements, static current in the level shifters is at a low level. With low current and high slew rates, the level shifters may false trip in response to charging and discharging currents from parasitic capacitances. High voltage components in the circuit, such as large field effect transistors (FETs), may have high junction capacitances. False tripping of the level shifters may increase power dissipation by falsely turning on large power FETs, and may also damage the motor driver IC.

In examples herein, current is selectively increased in the level shifters to stabilize the level shifters if a voltage rail slew rate is high or if noise is present on the voltage rail. The current is increased temporarily, but not permanently, to keep overall power consumption at an acceptable level. In one example, current is added responsive to the power FETs switching. A digital controller controls the switching of the power FETs, and that digital controller can also control a current source that adds current to the circuit at the appropriate time. Additionally, current may be added by other circuitry responsive to sensing a high slew of a voltage source. Circuitry that adds current responsive to sensing the high slew may also add current if a fault or noise occurs that causes a high slew of the voltage source.

Figure 1:
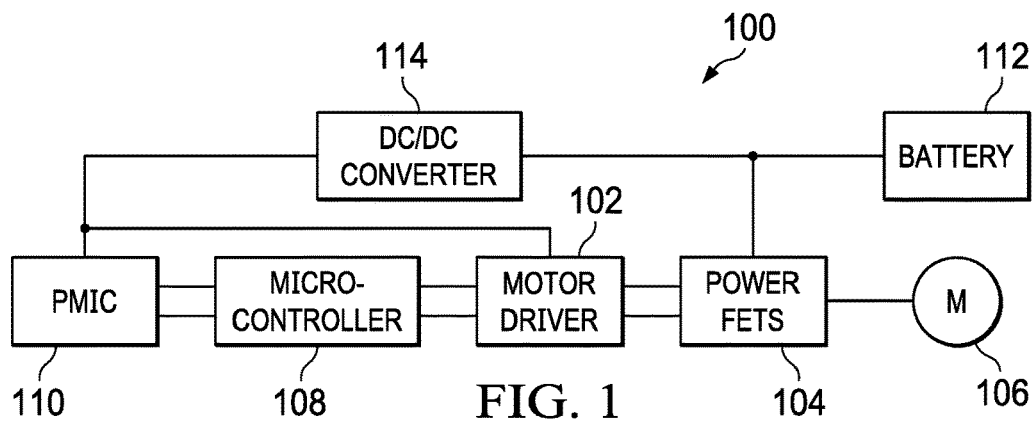
FIG. 1 is a block diagram of a system for motor drive in accordance with various examples.

FIG. 1 illustrates a system 100 for motor drive in accordance with various examples herein. The motor drive may be a component of a mild hybrid electric vehicle in one example. In a mild hybrid electric vehicle, an internal combustion engine turns off while the vehicle is coasting. With the internal combustion engine off, a motor-drive system charges a battery to provide electricity for the vehicle. Mild hybrid electric vehicles may have reduced emissions at lower cost than full electric vehicles and provide design flexibility. The motor-drive system may be coupled to the transmission system of the vehicle in different places, such as a rear axle, a crankshaft, or through a belt.

System 100 includes motor driver 102, power FETs 104, motor 106, microcontroller 108, power management integrated circuit (PMIC) 110, battery 112, and direct current/direct current (DC/DC) converter 114. Motor driver 102 is a chip or integrated circuit (IC) in one example, which performs various operations as described below. Motor driver 102 drives power FETs 104, which are coupled to motor 106 and selectively provide power from battery 112 to motor 106 so as to drive motor 106. Battery 112 may be a 48-V battery in one example. DC-DC converter 114 is a buck regulator that down-converts the 48 V supply to a smaller value, such as 12 V. PMIC 110 performs functions related to power management, and helps to control the electrical power of system 100. Microcontroller 108 provides control operations for system 100 in one example.

In examples herein, motor driver 102 drives power FETs 104 to provide power to motor 106 (e.g., high voltage and/or high current). Level shifters inside motor driver 102 help to drive power FETs 104. The level shifters are shown in subsequent figures and are described below. The level shifters may operate from a high voltage rail, such as a 105 V voltage rail. Static current in the level shifter is relatively small to meet power dissipation requirements. The high voltage rail may have a high slew rate. For example, the voltage on the high voltage rail may transition from 15 V to 105 V at a rate of greater than 1 V per nanosecond. In existing systems, the level shifter may false trip due to currents from parasitic capacitance within the circuit, particularly within large FETs. Some high voltage FETs may have high junction capacitances, which may cause a level shifter to false trip. If the level shifters false trip, power FETs may be falsely turned on which can increase power dissipation and/or damage the circuits.

In examples herein, circuitry within motor driver 102 provides additional current to the level shifters at specific times to prevent the level shifters from false tripping. First, current may be added when the power FETs, such as power FETs 104, are switching. Because circuit components such as motor driver 102 and/or microcontroller 108 control the switching of power FETs 104 with a digital signal, that digital signal may also control circuitry that provides additional current at the appropriate time. Second, additional circuitry may add current to the level shifters if a change in the voltage level of the high voltage rail is detected. Any suitable circuitry is useful for detecting the change in the voltage level of the voltage rail and then providing additional current. Examples of the circuitry within motor driver 102 that provides these two functions is described below.

Figure 2:
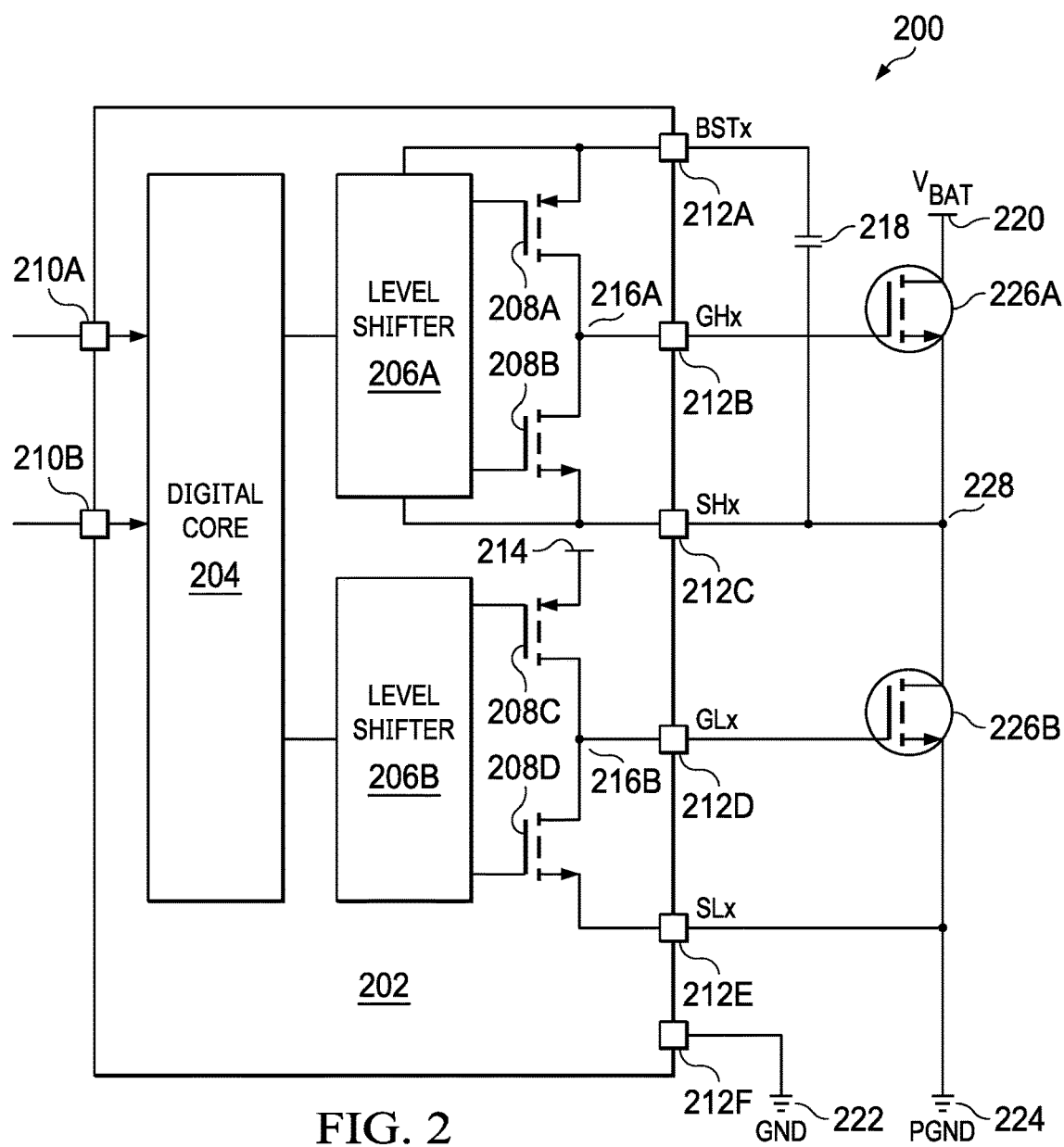
FIG. 2 is a diagram of a system for motor drive in accordance with various examples.

FIG. 2 is a system 200 for motor drive in accordance with various examples herein. System 200 includes motor driver 202, which may be motor driver 102 in some examples. System 200 also includes digital core 204, level shifters 206A and 206B (collectively, level shifters 206), and FETs 208A, 208B, 208C, and 208D (collectively, FETs 208). Motor driver 202 includes inputs 210A and 210B, outputs 212A, 212B, 212C, 212D, 212E, and 212F, voltage supply 214, and nodes 216A and 216B. System 200 also includes capacitor 218, voltage source $V_{BAT}$ 220, ground 222, ground 224, power FETs 226A and 226B (collectively, power FETs 226), and node 228. In one example, power FETs 226A and 226B may be part of power FETs 104 in FIG. 1. While many of the examples herein use FETs, other types of transistors may be used in other examples. In some examples, a supply voltage value for level shifter 206A may be 85 V or 115 V. In some examples, the voltage value at node 212C may be 65 V or 90 V. In some examples, a supply voltage value for level shifter 206B may be 12 V at voltage supply 214. In some examples, a voltage value at node 212E may be 0 V.

Motor driver 202 communicates with a microcontroller (such as microcontroller 108 in FIG. 1) via inputs 210A and 210B. Digital core 204 communicates with the microcontroller and also with level shifters 206. Digital core 204 may provide control signals to level shifters 206 to manage the operations of level shifters 206.

Level shifter 206A is coupled to and drives FETs 208A and 208B. In one example, FET 208A is a p-type transistor (such as a p-type metal-oxide-silicon FET, pMOSFET or pMOS) and FET 208B is an n-type transistor (such as a n-type metal-oxide-silicon FET, nMOSFET or nMOS). FET 208A includes a gate coupled to level shifter 206A, a source coupled to output 212A, and a drain coupled to node 216A. Output 212A may be coupled to a bootstrap voltage BST (labeled BSTx in FIG. 2). Node 216A is coupled to output 212B. The gate of FET 208A may swing between BST (in some examples, BST may range from approximately 15 V to 105 V and may slew between these voltages as discussed herein) and (BST-5 V) in one example.

FET 208B includes a gate coupled to level shifter 206A, a drain coupled to node 216A, and a source coupled to output 212C. FETs 208A and 208B operate to drive power FET 226A. Power FET 226A is, in some example embodiments, an n-type transistor (e.g., an nMOS device) with a gate coupled to output 212B (GHx), a drain coupled to a voltage source $V_{BAT}$ 220, and a source coupled to output 212C (SHx). Also, output 212C is coupled to a first terminal of a capacitor 218. A second terminal of capacitor 218 is coupled to the bootstrap voltage BSTx. The gate of FET 208B may swing between the voltage at SHx and (SHx+5 V) in one example.

Level shifter 206B is coupled to and drives FETs 208C and 208D. In one example, FET 208C is a p-type transistor (e.g., a pMOS device) and FET 208D is an n-type transistor (e.g., an nMOS device). FET 208C includes a gate coupled to level shifter 206B, a source coupled to voltage supply 214, and a drain coupled to node 216B. Node 216B is coupled to output 212D. The gate of FET 208C may swing between a voltage $V_{214}$ at voltage supply 214 and ($V_{214}$-5 V) in one example.

FET 208D includes a gate coupled to level shifter 206B, a drain coupled to node 216B, and a source coupled to output 212E. FETs 208C and 208D operate to drive power FET 226B. Power FET 226B is an n-type transistor (e.g., an nMOS device) with a gate coupled to output 212D (GLx), a drain coupled to the source of power FET 226A, and a source coupled to output 212E (SLx). Also, output 212E may be coupled to ground 224. Output 212F may be coupled to ground 222. In one example, node 228 may be coupled to additional power FETs or may be coupled to a motor, such as motor 106 in FIG. 1.

In operation, motor driver 202 drives power FETs 226A and 226B to produce a voltage and current at node 228, which drives a motor such as motor 106. Appropriate control signals from level shifters 206A and 206B drive FETs 208, which in turn drive power FETs 226. Microcontroller 108 in FIG. 1 may control the operation of motor driver 202 in some examples.

In examples herein, level shifters 206 include circuitry that provides additional current to the level shifters 206 at specific times to prevent the level shifters 206 from false tripping, as described above with respect to FIG. 1. Examples of this circuitry within level shifters 206 are described below.

Figure 3:
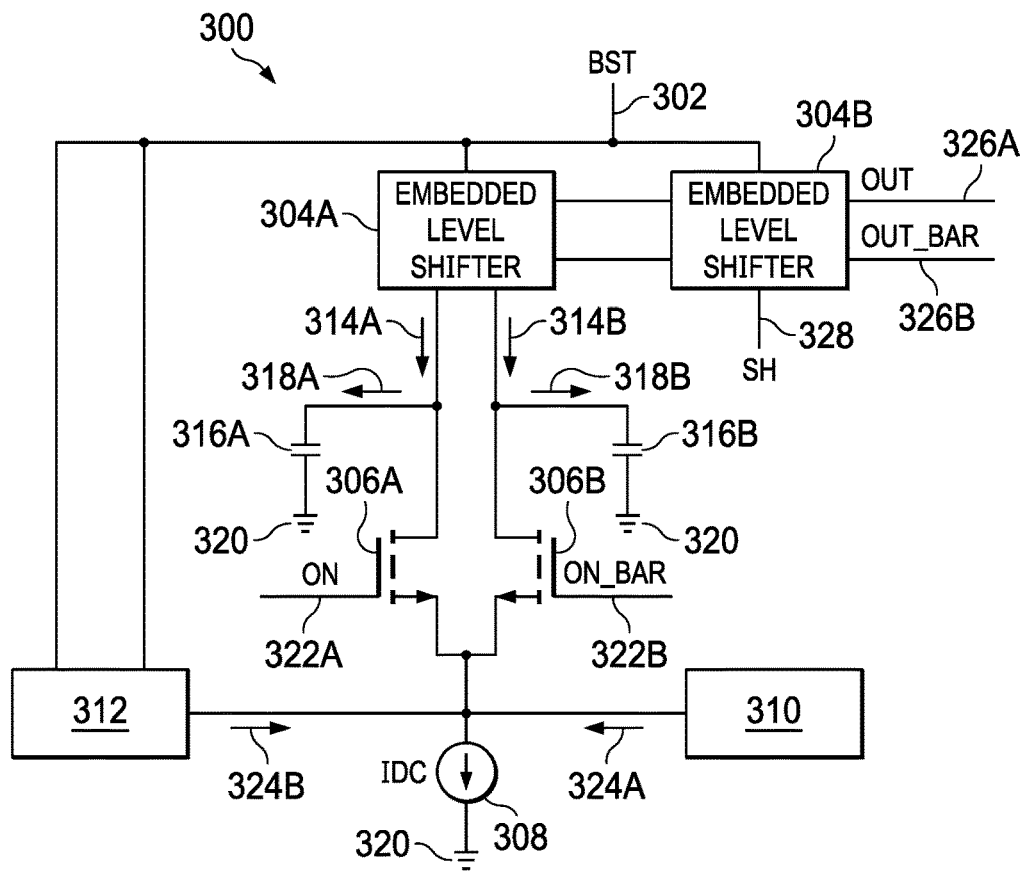
FIG. 3 is a circuit diagram of a level shifter in accordance with various examples.

FIG. 3 is a level shifter 300 in accordance with various examples herein. In one example, level shifter 300 is a level shifter 206 described in FIG. 2. Level shifter 300 includes a bootstrap voltage BST 302 (which may be connected to 212A for level shifter 206A or 214 for level shifter 206B), embedded level shifters 304A and 304B, FETs 306A and 306B (collectively, FETs 306), current source 308, current source 310, and slew detector 312. Level shifter 300 also includes currents 314A and 314B, capacitors 316A and 316B, capacitive currents 318A and 318B, and ground 320. FET 306A includes a gate 322A and FET 306B includes a gate 322B. A drain of FET 306A and a drain of FET 306B are coupled to level shifter 304A. A source of FET 306A and a source of FET 306B are coupled to current source 308. Current source 310 is coupled to current source 308, and slew detector 312 is coupled to BST 302 and to current source 308. Current source 310 provides current 324A and slew detector 312 provides current 324B. Current 324A may be referred to as feed forward current in one example. Level shifter 304B provides outputs 326A (OUT) (which may be connected to gate of 208A for level shifter 206A and the gate of 208C for level shifter 206B), 326B (OUT_BAR) (which may be connected to gate of 208B for level shifter 206A and the gate of 208D for level shifter 206B), and 328 (SH, which is 212C in FIG. 2 in one example).

Embedded level shifters 304A and 304B are configured to convert the ground-referenced differential signals 322A and 322B to BST-referenced differential signals 326A and 326B. Output signals 326A and 326B may or may not be both used in subsequent systems, but both are created to provide a robust glitch-free differential signal. In one example, level shifters 304A and 304B may each include a latch or current mirror within the level shifter 304A and 304B. FETs 306A and 306B provide current to level shifter 304A. Current source 308 is configured to provide a bias current for FETs 306. In operation, signals are applied to gate 322A and 322B (ON and ON_BAR, respectively), to turn FETs 306A and 306B alternatively on and off. Capacitors 316A and 316B represent routing capacitances and parasitic capacitances of the drain junctions of FETs 306A and 306B, respectively. BST 302 slews from approximately 15 V to approximately 105 V in this example. As BST 302 slews up or slews down, the slew rate may be greater than 1 V per nanosecond. When the slew rates are high, currents 314A and 314B increase. Currents 314A and 314B may falsely change due to currents 318A and 318B in parasitic capacitances 316A and 316B. The currents 314 can then overwhelm the current from current source 308. When current source 308 is overwhelmed, FETs 306A or 306B may turn on falsely. False turn-on of FETs 306 may cause false turn-on of power FETs 226A and 226B in FIG. 2. False turn-on of power FETs 226 may damage system 200.

False turn-on may be prevented with various solutions described herein. One solution is to increase current from current source 308. However, if current from current source 308 is permanently increased, power consumption is increased. In one example herein, current 324A is added to the current from current source 308 with current source 310. Current source 310 may include any circuitry to provide current 324A. Current 324A is provided when FETs 306 switch states (e.g., from on to off). FETs 306 switch states responsive to digital signals (ON and ON_BAR) applied to the gates (e.g., gates 322) of FETs 306. This digital signal, or an equivalent signal, may be used to turn on and off current source 310 to provide current 324A at the appropriate time. Motor driver 102 and/or microcontroller 108 in FIG. 1 turns FETs 306 on and off using the ON and ON_BAR signals and controls the voltage at BST 302. Therefore, motor driver 102 and/or microcontroller 108 may also turn current source 310 on or off as needed to provide additional current in level shifter 300. Current source 310 may be turned on for an appropriate amount of time. Current source 310 may be turned on slightly before and slightly after the slew time of BST 302. The waveforms in FIG. 4, described below, provide a depiction of BST 302 and current 324A.

In another example, slew detector 312 provides current 324B to prevent false tripping of power FETs 226 in FIG. 2. In operation, slew detector 312 is coupled to BST 302. Slew detector 312 includes circuitry configured to determine when BST 302 slews up from approximately 15 to approximately 105 V, and slews down from approximately 105 to approximately 15 V. Any appropriate circuitry may be included in slew detector 312 to perform these operations. Examples of the circuitry of slew detector 312 are described below. If slew detector 312 detects that BST 302 slews up or down, slew detector 312 provides additional current 324B to level shifter 300. This additional current prevents power FETs 226 in FIG. 2 from false tripping.

Slew detector 312 provides an additional function in some examples. Noise may occur outside of the transition times of BST 302 that cause current source 310 to turn on. For example, if a motor driver 102 is a 3-phase motor driver (where, for example, a separate system 200 is used to drive each phase of the 3-phase motor—so there would be three systems 200), ground 222 may be different than ground 224 in FIG. 2 when the phase switches. Battery 112 in FIG. 1 may also cause noise issues. Therefore, to keep the system (e.g., system 100, 200) under control during these transient noise conditions, slew detector 312 detects these noise conditions on BST 302 and increases the current 324B responsive to the noise conditions. While current 324A is increased responsive to a digital signal, current 324B is increased as certain conditions are detected. In one example, current 324A is increased for approximately 1 microsecond responsive to the digital signal. Current 324B is increased for 10 to 100 nanoseconds responsive to detecting slew in BST 302 in one example.

FIG. 4 is a collection of timing diagrams 400 for a level shifter in accordance with various examples herein. The x-axis represents time and the y-axis represents either voltage or current. Timing diagrams 400 show the values of various voltages and currents during operation of the systems (100, 200) described above with respect to FIGS. 1-3. Waveform 402 is the value of the bootstrap voltage, such as BST 302 in one example. Waveform 404 is the current from current source 308 in one example. Waveform 406 is the current 324A from current source 310 in one example. Waveform 408 is the current 324B from slew detector 312 in one example.

Waveform 402 shows that BST 302 rises from 15 V to 105 V between times $t_2$ and $t_3$, and falls from 105 V to 15 V between times $t_8$ and $t_9$. The slew rate for waveform 402 (calculated, e.g., by [(105V−15V)/($t_3$−$t_2$)] or [(15V−105V)/($t_9$−$t_8$)]) and may be high, and could cause false tripping of power FETs in existing systems. In examples herein, currents 324A and 324B are provided to level shifter 300 to prevent false tripping.

In this example, current source 308 provides a steady current during operation, shown as waveform 404. BST 302 rises from 15 V to 105 V between times $t_2$ and $t_3$. This change in BST 302 is controlled by a controller in system 100, such as motor driver 102 or microcontroller 108. Because the time when BST 302 begins rising (e.g., $t_2$) is known by a controller, current from current source 310 (e.g., current 324A) may be increased at time $t_1$, before BST 302 begins rising. Waveform 406 shows current 324A increasing at time $t_1$ in anticipation of BST 302 rising at time $t_2$. At time $t_3$, BST 302 has reached the value of 105 V and stopped rising. Current 324A from current source 310 remains high until time $t_4$, which occurs after time $t_3$. Therefore, current 324A is added to level shifter 300 during the time taken for BST 302 to rise (e.g., between times $t_2$ and $t_3$), along with an additional margin of time before time $t_2$ and after $t_3$. The additional margin of time may be any suitable length. The margin of time helps to ensure that the full slew time (e.g., between $t_2$ and $t_3$) is completely covered with additional current 324A from current source 310.

Also, current 324B is added to level shifter 300 between times $t_2$ and $t_3$. Current 324B is provided by slew detector 312 in one example. Slew detector 312 detects the rise or fall in BST 302, using any suitable circuitry. When a rise or fall in BST 302 is detected, slew detector 312 provides current 324B to level shifter 300. As shown in waveform 408, slew detector 312 has detected the rise of BST 302 at time $t_2$ and begun adding current 324B to level shifter 300. Current is added by slew detector 312 until BST 302 stops slewing, which occurs at time $t_3$ in this example. Current 324B therefore is added for less time than current 324A in this example. As described above, current 324A may be added for approximately one microsecond. Current 324B may be added for a smaller amount of time, such as approximately 10 to 100 nanoseconds. In one example, the current provided by current source 308, represented by waveform 404, is approximately 1 to 10 microamps at a steady state. The current added by current 324A and current 324B may increase the total current in level shifter 300 to approximately 200 to 300 microamps between times $t_2$ and $t_3$ in one example. This additional current helps to prevent false tripping of power FETs 104 in system 100.

FIG. 4 also shows an example of how noise is detected and handled by level shifter 300. At time $t_5$, a noise event occurs on BST 302 (waveform 402). The noise causes a temporary increase in BST 302. This noise event could cause a power FET 226 to false trip if no additional current is added to level shifter 300. However, slew detector 312 detects the increase in BST 302 caused by the noise event and provides current to level shifter 300 at time $t_5$. At time $t_6$, the noise event ends and BST 302 returns to 105 V. Responsive to BST 302 dropping back to 105 V, slew detector 312 reduces the added current 324B at time $t_6$. Therefore, slew detector 312 may be used to boost current in response to noise events to maintain the proper working conditions of level shifter 300.

FIG. 4 shows that BST 302 falls from 105 V to 15 V at time $t_5$. Current source 310 and slew detector 312 provide currents 324A and 324B, respectively, in response to the fall in BST 302 similarly to how these components provided current in response to the rise in BST 302 at time $t_2$. First, current source 310 is controlled by a controller, and turns on before time $t_5$, at time $t_7$, in anticipation of the negative slew of BST 302. BST 302 finishes slewing at time $t_9$, so current source 310 provides additional current 324A between times $t_7$ and $t_{10}$ to cover the slewing time of BST 302. Also, slew detector 312 detects the slew of BST 302 at time $t_5$ and provides current 324B to level shifter 300. At time $t_9$, BST 302 has finished slewing, so slew detector 312 stops providing current 324B to level shifter 300.

As shown in FIG. 4, current may be added to level shifter 300 at appropriate times to prevent false tripping of FETs, such as power FETs 104. In this example, current is added from two different sources, current source 310 and slew detector 312. The additional current is added at the appropriate time and then turned off when no longer useful, in order to stay below overall current consumption guidelines for level shifter 300.

Figure 5:
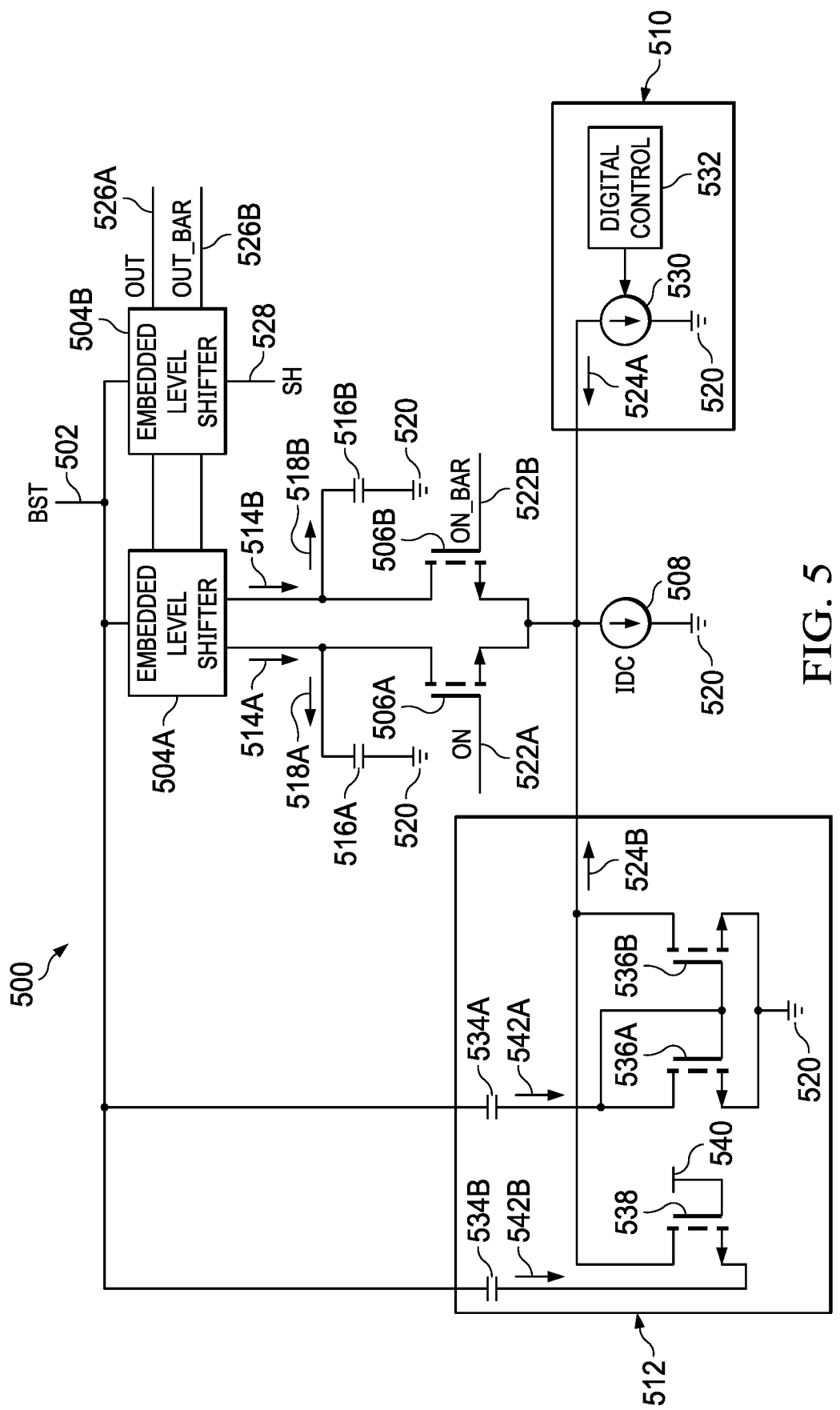
FIG. 5 is a circuit diagram of a level shifter in accordance with various examples.

FIG. 5 is a level shifter 500 in accordance with various examples herein. The structure and operation of level shifter 500 is similar to level shifter 300 described above with respect to FIG. 3. Therefore, some of the details of the operation of level shifter 500 are omitted here for simplicity.

In one example, level shifter 500 is a level shifter 206 described in FIG. 2. Level shifter 500 includes a bootstrap voltage BST 502, embedded level shifters 504A and 504B, FETs 506A and 506B (collectively, FETs 506), current source 508, current source 510, and slew detector 512. Level shifter 500 also includes currents 514A and 514B, capacitances 516A and 516B, capacitive currents 518A and 518B, and ground 520. FET 506A includes a gate 522A and FET 506B includes a gate 522B. A drain of FET 506A and a drain of FET 506B are coupled to level shifter 504A. A source of FET 506A and a source of FET 506B are coupled to current source 508. Current source 510 is coupled to current source 508, and slew detector 512 is coupled to BST 502 and to current source 508. Current source 510 provides current 524A and slew detector 512 provides current 524B. Level shifter 504B provides outputs 526A (OUT), 526B (OUT_BAR), and 528 (SH, which is 212C in FIG. 2 in one example). Some features of system 500, such as features 504, 506, and 508, are functionally and/or structurally similar to features 304, 306, and 308 described above.

In this example, current source 510 includes a current source 530 coupled to ground 520 and to current source 508, in parallel with current source 508. Current source 530 provides current 524A to level shifter 500. Digital control 532 turns current source 530 on and off. In other examples, controller 532 also controls the magnitude of current provided by current source 530. As described above, digital control 532 may be a signal from motor driver 102 or microcontroller 108 in some examples. Digital control 532 turns on current source 530 at the appropriate time before BST 502 begins slewing (e.g., time $t_1$ in FIG. 4). Digital control 532 turns off current source 530 at the appropriate time after BST 502 has completed slewing (e.g., time $t_4$ in FIG. 4). In other examples, current source 510 may include different circuitry that provides the functions described herein.

Slew detector 512 is one example of circuitry that can provide slew detection in accordance with various examples herein. Other circuitry may be useful in slew detector 512 to provide similar functionality in other examples. The circuitry shown within slew detector 512 is merely one example of how a slew detector 512 may detect slew of BST 502 and provide current 524B to level shifter 500. In this example, slew detector 512 includes capacitors 534A and 534B, FETs 536A, 536B, and 538, and voltage source 540. Capacitor 534A is coupled to BST 502 and FET 536A. Capacitor 534B is coupled to BST 502 and FET 538. A gate of FET 538 is coupled to voltage source 540. In one example, voltage source 540 provides approximately 5 V to the gate of FET 538. Currents 542A and 542B are also shown in slew detector 512. In one example, FETs 536A, 536B, and 538 are n-channel transistors. In other examples, one or more of FETs 536A, 536B, and 538 may be p-channel transistors.

Capacitors 534A and 534B are useful for detecting if slew has occurred on BST 502. For a capacitor, the current through the capacitor equals the capacitance multiplied by the instantaneous rate of voltage change ($I=C(dV/dt)$). Therefore, as a change in BST 502 occurs (e.g., $dV/dt$), the current I (542A or 542B) through the capacitor (534A or 534B) increases. This increased current (542A or 542B) through the capacitors 534A or 534B is provided to level shifter 500 as current 524B, using the circuitry shown in slew detector 512.

In one example, capacitor 534A detects a positive slew of BST 502, and capacitor 534B detects a negative slew of BST 502. When BST 502 slews positive (e.g., from 15 V to 105 V), current 542A through capacitor 534A is increased. Current 542A is provided to FET 536A, which is configured as a current mirror with FET 536B. The gates of FETs 536A and 536B are coupled together, and the sources of FETs 536A and 536B are coupled to ground 520. The drain of FET 536A is coupled to the gate of FET 536A. Current 542A is mirrored with the current mirror, and may be multiplied by the current mirror. The current provided by the current mirror is current 524B, which is provided to current source 508. In some examples, current 524B is larger than the current provided by current source 508. The additional current 524B helps to prevent level shifter 500 from false tripping as described above.

When BST 502 slews negative, current is drawn away from the current mirror of FETs 536A and 536B, and therefore the current mirror turns off. However, capacitor 534B detects the negative slew of BST 502 and current 542B increases. FET 538 provides current 542B to level shifter 500, which is shown as current 524B. Therefore, current 524B may be provided to level shifter 500 when BST 502 slews either positive or negative. In some examples, capacitor 534B may be larger than capacitor 534A. The current through capacitor 534A (e.g., current 542A) is multiplied by the current mirror of FETs 536A and 536B. Current 542A can therefore be smaller than current 542B, which is not multiplied by a current mirror in this example. Because current 542B can be larger than current 542A in some examples, a larger capacitor 534B provides this larger current.

Figure 6:
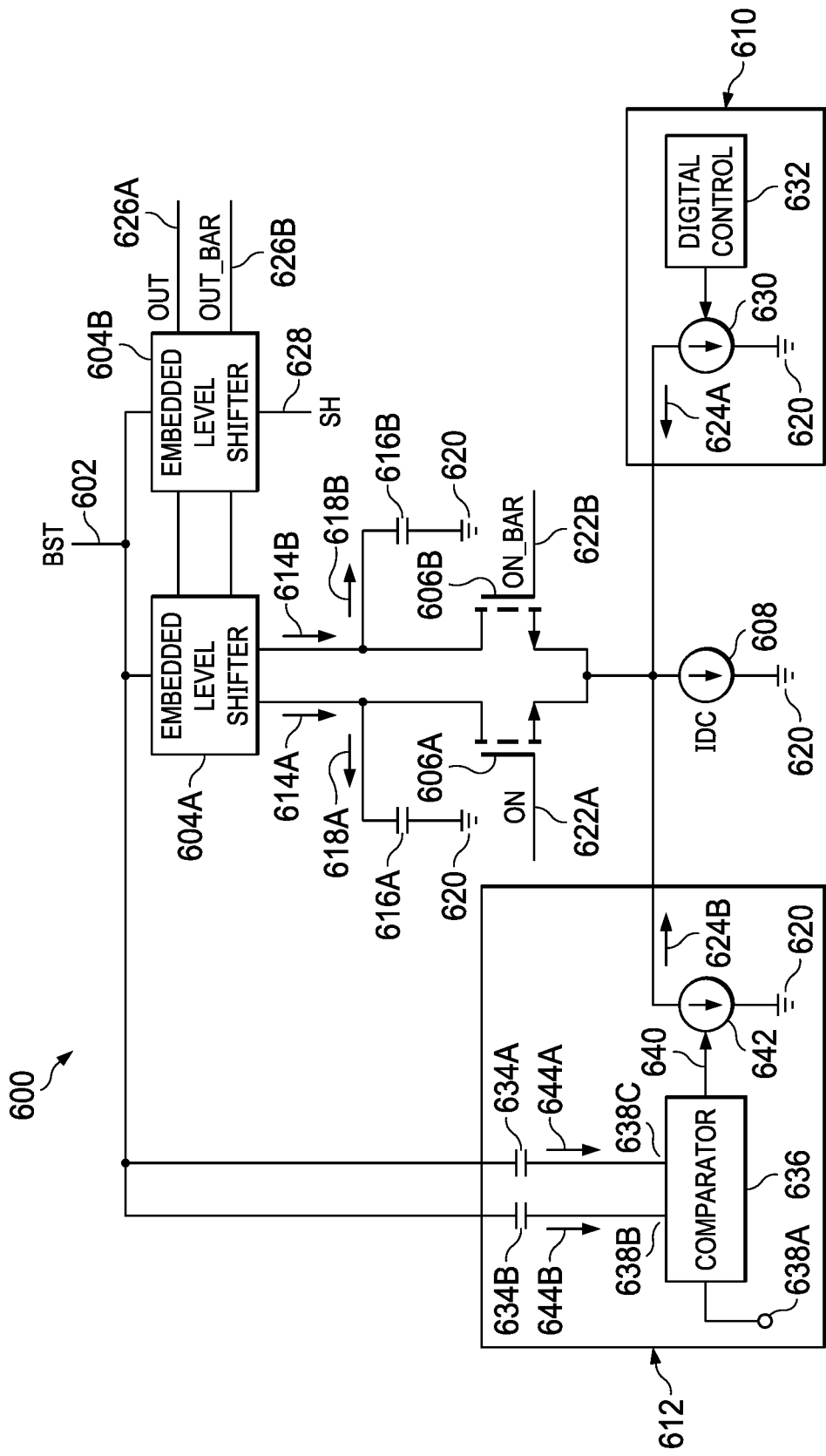
FIG. 6 is a circuit diagram of a level shifter in accordance with various examples.

FIG. 6 is a level shifter 600 in accordance with various examples herein. The structure and operation of many components of level shifter 600 are similar to the components in level shifter 300 and level shifter 500 described above. Therefore, some of the details of the operation of level shifter 600 are omitted here for simplicity.

In one example, level shifter 600 is a level shifter 206 described in FIG. 2. Level shifter 600 includes a bootstrap voltage BST 602, embedded level shifters 604A and 604B, FETs 606A and 606B (collectively, FETs 606), current source 608, current source 610, and slew detector 612. Level shifter 600 also includes currents 614A and 614B, capacitances 616A and 616B, capacitive currents 618A and 618B, and ground 620. FET 606A includes a gate 622A and FET 606B includes a gate 622B. A drain of FET 606A and a drain of FET 606B are coupled to level shifter 604A. A source of FET 606A and a source of FET 606B are coupled to current source 608. Current source 610 is coupled to current source 608, and slew detector 612 is coupled to BST 602 and to current source 608. Current source 610 provides current 624A and slew detector 612 provides current 624B. Level shifter 604B provides outputs 626A (OUT), 626B (OUT_BAR), and 628 (SH, which is 212C in FIG. 2 in one example). Some features of level shifter 600, such as features 604, 606, and 608, are functionally and/or structurally similar to features 304, 306, and 308 described above.

In this example, current source 610 includes a current source 630 coupled to ground 620 and to current source 608, in parallel with current source 608. Current source 630 provides current 624A to level shifter 600. Digital control 632 turns current source 630 on and off. In this example, current source 610 operates similarly to current source 510 in FIG. 5. Current source 610 is turned on and off responsive to digital control 632, which is coordinated with the timing of the slew of BST 602, as described above with respect to FIG. 4.

In this example, slew detector 612 includes capacitors 634A and 634B, comparator 636, comparator inputs 638A, 638B, and 638C, comparator output 640, current source 642, and currents 644A and 644B. Slew detector 612 detects slew of BST 602 and provides current 624B to level shifter 600, using comparator 636. In operation, capacitors 634A and 634B detect the slew of BST 602 as described above with respect to FIG. 5. As BST 602 slews positive, current 644A from capacitor 634A is provided to comparator 636 at comparator input 638C. Comparator 636 compares the value of current 644A to a reference current provided to comparator 636 at comparator input 638A. If current 644A is above (or below in some examples) the value of the reference current, a positive slew of BST 602 is detected. Responsive to detecting a positive slew, comparator output 640 of comparator 636 provides a control signal to current source 642 that turns on current source 642. Current source 642 provides current 624B to level shifter 600 to help prevent false tripping in level shifter 600. In some examples, the magnitude of current provided by current source 642 is based on the magnitude of the output of comparator 636.

Similarly, as BST 602 slews negative, current 644B from capacitor 634B is provided to comparator 636 at comparator input 638B. Comparator 636 compares the value of current 644B to the reference current provided to comparator 636 at comparator input 638A. If current 644B is above (or below in some examples) the value of the reference current, a negative slew of BST 602 is detected. Responsive to detecting a negative slew, comparator output 640 of comparator 636 provides a control signal to current source 642 that turns on current source 642. Current source 642 provides current 624B to level shifter 600. Therefore, in this example, both positive and negative slews of BST 602 are detected. Responsive to detection of either slew, current source 642 is turned on by comparator 636 to provide additional current to level shifter 600. Therefore, slew detector 612 helps to prevent false tripping in level shifter 600 by using a different method than the method described above with respect to FIG. 5.

Figure 7:
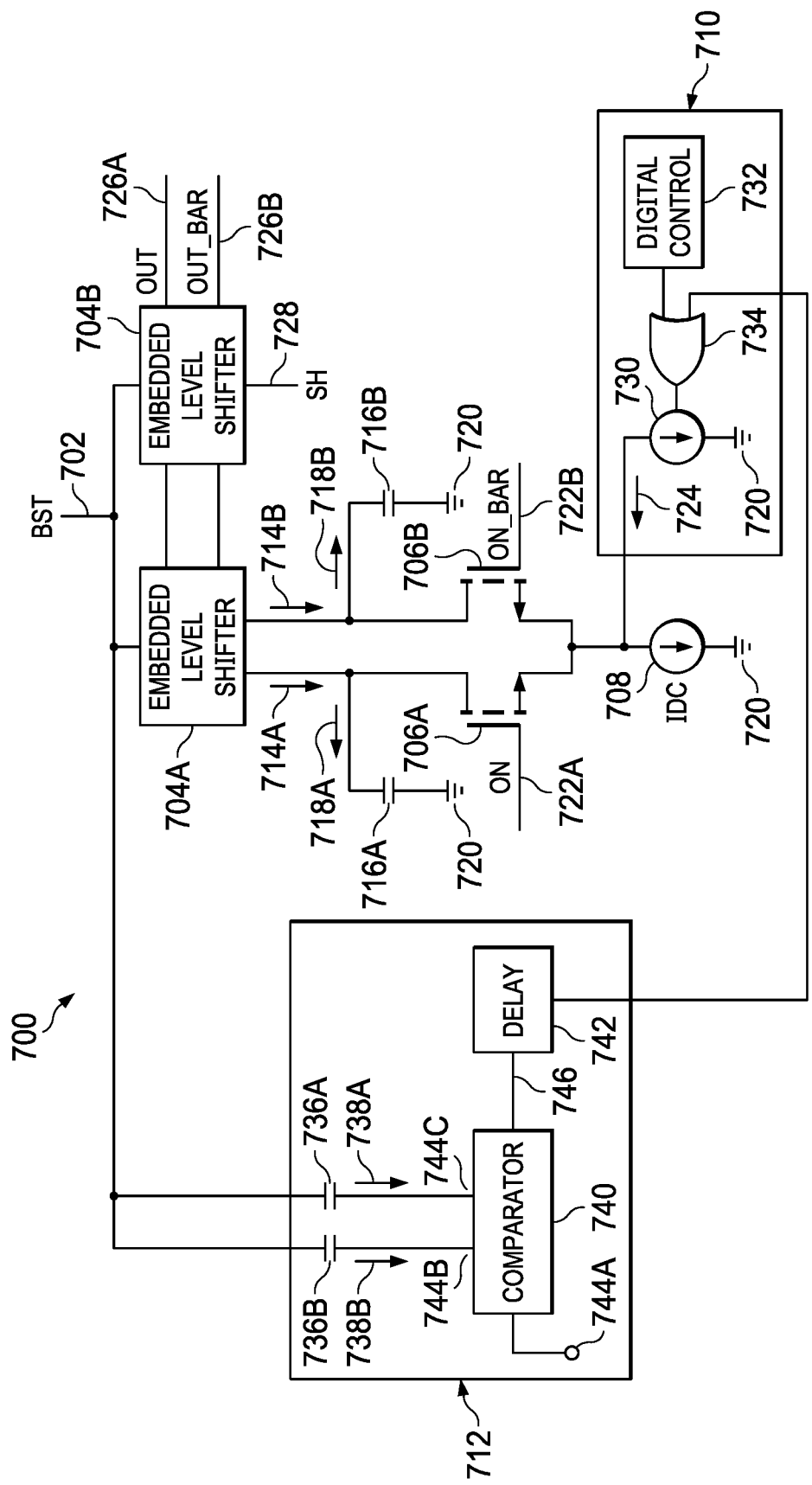
FIG. 7 is a circuit diagram of a level shifter in accordance with various examples.

FIG. 7 is a level shifter 700 in accordance with various examples herein. The structure and operation of many components of level shifter 700 are similar to the components in level shifter 300 and level shifter 500 described above. Therefore, some of the details of the operation of level shifter 700 are omitted here for simplicity.

In one example, level shifter 700 is a level shifter 206 described in FIG. 2. Level shifter 700 includes a bootstrap voltage BST 702, embedded level shifters 704A and 704B, FETs 706A and 706B (collectively, FETs 706), current source 708, current source 710, and slew detector 712. Level shifter 700 also includes currents 714A and 714B, capacitances 716A and 716B, capacitive currents 718A and 718B, and ground 720. FET 706A includes a gate 722A and FET 706B includes a gate 722B. A drain of FET 706A and a drain of FET 706B are coupled to level shifter 704A. A source of FET 706A and a source of FET 706B are coupled to current source 708. Current source 710 is coupled to current source 708, and slew detector 712 is coupled to BST 702 and to current source 710. In operation, current source 710 provides current 724 to level shifter 700. Level shifter 704B provides outputs 726A (OUT), 726B (OUT_BAR), and 728 (SH, which is 212C in FIG. 2 in one example). Some features of level shifter 700, such as features 704, 706, and 708, are functionally and/or structurally similar to features 304, 306, and 308 described above.

In this example, current source 710 includes a current source 730 coupled to ground 720 and to current source 708, in parallel with current source 708. Current source 730 provides current 724 to level shifter 700. Current source 710 also includes digital control 732 and OR gate 734. Slew detector 712 includes capacitors 736A and 736B, currents 738A and 738B, comparator 740, and delay 742. Comparator 740 includes comparator inputs 744A, 744B, and 744C, and comparator output 746.

Level shifter 700 provides current 724 responsive to a signal from digital control 732 or responsive to detecting slew of BST 702 with slew detector 712. An OR gate 734 is used to turn current source 730 on responsive to either of those two conditions. Digital control 732 operates similarly to digital control 632 in FIG. 6 and digital control 532 in FIG. 5. Digital control 732 turns current source 730 on by providing a control signal through OR gate 734 to current source 730. Digital control 732 may be a signal from motor driver 102 or microcontroller 108 in some examples. Digital control 732 turns on current source 730 at the appropriate time before BST 702 begins slewing (e.g., time $t_1$ in FIG. 4). Digital control 732 turns off the signal to current source 730 at the appropriate time after BST 702 has completed slewing (e.g., time $t_4$ in FIG. 4). If no other signal is present at OR gate 734 at the time digital control 732 turns off the signal to current source 730, then current source 730 turns off.

Slew detector 712 detects slew of BST 702 similarly to slew detector 612 as described above with respect to FIG. 6. Capacitors 736A and 736B provide currents 738A and 738B, which increase as BST 702 slews. As BST 702 slews positive, current 738A from capacitor 736A is provided to comparator 740 at comparator input 744C. Comparator 740 compares the value of current 738A to a reference current provided to comparator 740 at comparator input 744A. If current 738A is above the value of the reference current, a positive slew of BST 702 is detected. Responsive to detecting a positive slew, comparator output 746 of comparator 740 provides a signal to delay 742. Delay 742 may be omitted in some examples. Delay 742 may be any suitable delay element embodied in analog or digital circuitry. In this example, delay 742 turns on quickly with no delay or a small delay. Delay 742 provides the signal from comparator 740 that indicates a slew of BST 702 was detected to OR gate 734. This signal is provided to current source 730 and turns on current source 730. Therefore, if a positive slew is detected, current source 730 turns on. If current source 730 is already on due to digital control 732, current source 730 remains on. Current source 730 turns off when no signal is present at either input of OR gate 734.

In an example, delay 742 turns on quickly but turns off more slowly. For example, delay 742 may have a programmable delay for the turn-off, such as 100 nanoseconds. Delay 742 therefore turns off if the signal from comparator output 746 turns off, but only after the 100 nanosecond delay. This turn-off delay allows the components of level shifter 700 to settle before returning to the low-current operating mode after a slew event. The turn-off delay could be fixed or could be programmable in some examples. In other examples, delay 742 could be absent from slew detector 712, and the signal from comparator output 746 could be provided directly to OR gate 734.

Similarly, as BST 702 slews negative, current 738B from capacitor 736B is provided to comparator 740 at comparator input 744B. Comparator 740 compares the value of current 738B to the reference current provided to comparator 740 at comparator input 744A. If current 738B is above the value of the reference current, a negative slew of BST 702 is detected. Responsive to detecting a negative slew, comparator output 746 of comparator 740 provides a control signal to delay 742. Delay 742 turns on quickly with no delay or a small delay as described above. Delay 742 provides the signal from comparator 740 that indicates a slew of BST 702 was detected to OR gate 734. This signal is provided to current source 730 and turns on current source 730. Therefore, if a negative slew is detected, current source 730 turns on.

In the example of level shifter 700, current 724 is provided to level shifter 700 to prevent false tripping. Current 724 is provided either with digital control 732 or with detection of slew of BST 702 by slew detector 712. Also, level shifter 700 can provide additional current 724 responsive to noise events occurring on BST 702. If a noise event occurs, slew detector 712 detects the change in voltage and provides a turn-on signal to current source 730 via OR gate 734. Therefore, even if current source 730 is not turned on by digital control 732, current source 730 may still be turned on by slew detector 712 in response to noise events on BST 702.

As described above, FIGS. 3, 5, 6, and 7 provide examples of how slew detection may be performed to increase current in a system, and examples of how a digital control may increase current in the system at appropriate times. However, other circuitry or solutions may be used in other examples. Digital circuitry could be used to detect slew in some examples. Slew could be detected using circuit components other than capacitors as described above. Any suitable circuitry to detect slew and/or increase current based on a control signal fall within the scope of this description.

Figure 8:
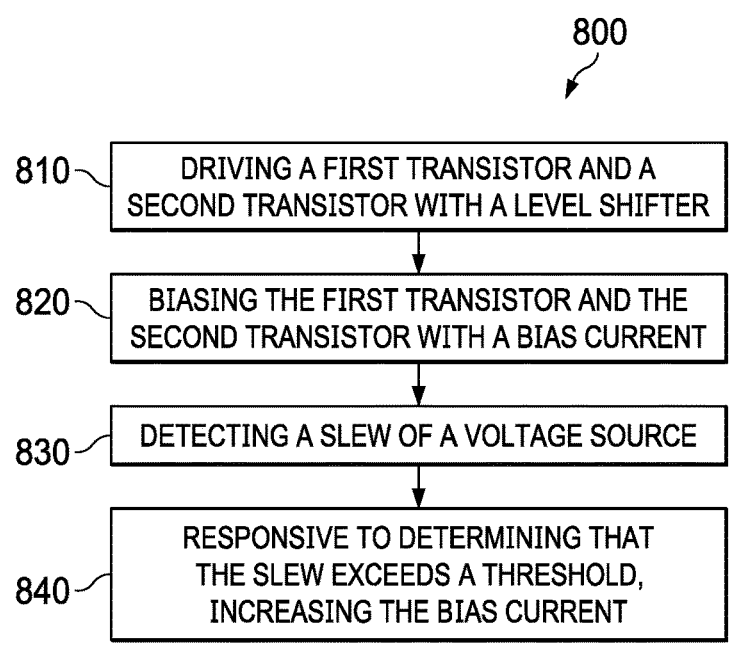
FIG. 8 is a flow diagram of a method for increasing current in a level shifter in accordance with various examples.

FIG. 8 is a flow diagram of a method 800 for increasing current in a level shifter in accordance with various examples herein. The steps of method 800 may be performed in any suitable order. The hardware components described above with respect to FIGS. 1, 2, 3, 5, 6, and/or 7 may perform method 800 in some examples.

Method 800 begins at 810, where a level shifter drives a first transistor and a second transistor. As an example, level shifter 304A in level shifter 300 drives FETs 306A and 306B.

Method 800 continues at 820, where a bias current biases the first transistor and the second transistor. As an example, current source 308 in level shifter 300 is coupled to FETs 306A and 306B and provides current for the operation of FETs 306.

Method 800 continues at 830, where a slew of a voltage source is detected. The voltage source in one example is BST 302. Detecting the slew may be accomplished in any number of suitable ways. As described above with respect to FIGS. 5, 6, and 7, various circuitry may be used by a slew detector to determine when the voltage from BST 302 changes. The voltage from BST 302 may change responsive to a control signal that controls power FETs, or the voltage may change responsive to noise or a fault. A slew detector may detect any of these conditions, with any suitable sensitivity. The systems described herein may then take any appropriate action based on detecting the slew.

Method 800 continues at 840, where the bias current is increased responsive to determining that the slew exceeds a threshold. As an example, current 324B is provided by slew detector 312 and added to the current provided by current source 308 to prevent false tripping of FETs during high slew events. As described above, a number of circuits and/or methods may be useful for increasing the bias current in response to a slew event.

In accordance with various examples herein, current is selectively increased in the level shifters to stabilize the level shifters if a voltage rail slew rate is high or if noise is present on the voltage rail. The current is increased temporarily, but not permanently, to keep overall power consumption at an acceptable level. In one example, current is added responsive to the power FETs switching. A digital controller controls the switching of the power FETs, and that digital controller can also control a current source that adds current to the circuit at the appropriate time. The current may be increased just before the transient event begins and then the current may be reduced after the transient event is finished. Additionally, current may be added by other circuitry responsive to sensing a high slew of a voltage source.

Current that is added by sensing the high slew may also add current if a fault or noise occurs that causes a high slew of the voltage source. The amount of current that is added may be proportional to the slew rate, which is accomplished in some examples by detecting the slew with a capacitor. With the examples herein, level shifters have adequate current to work properly during transient events without a significant increase in overall power consumption.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). While, in some examples, certain elements may be included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A system, comprising:
   a level shifter having voltage source input and first and second outputs;
   a first transistor having a first terminal coupled to the first output, and having a second terminal and a control terminal;
   a second transistor having a first terminal coupled to the second output, and having a second terminal and a control terminal;
   a first current source having a first terminal coupled to the second terminal of the first transistor and to the second terminal of the second transistor, and having a second terminal;
   a slew detector having an input coupled to the voltage source input and having an output coupled to the first terminal of the first current source; and
   a second current source coupled in parallel between the first and second terminals of the first current source.

2. The system of claim 1, wherein the slew detector includes a capacitor coupled to the voltage source input and also coupled to a current mirror.

3. The system of claim 2, wherein the capacitor is a first capacitor, and the slew detector further includes a second capacitor coupled to the voltage source input and also coupled to a third transistor.

4. The system of claim 3, wherein the current mirror and the third transistor are configured to provide current to the first current source.

5. The system of claim 3, wherein the slew detector includes a comparator configured to compare a current from the first capacitor or the second capacitor to a reference current.

6. The system of claim 5, wherein the slew detector provides current to the first current source responsive to the current from the first capacitor or the second capacitor exceeding the reference current.

7. The system of claim 2, wherein the slew detector is configured to detect an increase in a voltage at the voltage source input and provide a current to the first current source responsive to detecting the increase.

8. The system of claim 1, wherein the first current source is configured to bias the first transistor and the second transistor.

9. The system of claim 1, wherein the second current source is configured to provide current to the first current source responsive to an increase in voltage at the voltage source input.

10. A method, comprising:
    driving a first terminal of a first transistor and a first terminal of a second transistor with a level shifter, in which the first transistor and the second transistor each have a respective second terminal and a respective control terminal;
    biasing the second terminal of the first transistor and the second terminal of the second transistor with a bias current;
    detecting a slew of a voltage source; and
    responsive to determining that the slew exceeds a threshold, increasing the bias current.

11. The method of claim 10, further comprising:
    detecting the slew of the voltage source with a capacitor; and
    increasing the bias current with a current mirror coupled to the capacitor.

12. The method of claim 10, further comprising:
    increasing the bias current responsive to the first transistor or the second transistor turning on.

13. The method of claim 10, wherein detecting the slew of the voltage source includes:
    detecting a positive slew with a first capacitor; and
    detecting a negative slew with a second capacitor.

14. The method of claim 10, wherein determining that the slew exceeds the threshold includes comparing a reference current to a current from a capacitor coupled to the voltage source.

15. The method of claim 14, wherein, responsive to the comparison, a comparator output turns on a current source.

16. The method of claim 15, wherein the comparator output turns off the current source responsive to the slew falling below the threshold.

17. The method of claim 16, wherein a delay element delays the turn-off of the current source responsive to the slew falling below the threshold.

18. A system, comprising:
    a level shifter coupled to a voltage source, a first transistor, and a second transistor;
    a first current source coupled to the first transistor and the second transistor and configured to bias the first transistor and the second transistor;
    a slew detector coupled to the voltage source and to the first current source, wherein the slew detector is configured to detect a change in voltage of the voltage source, and further configured to provide current to the first current source responsive to detecting the change; and
    a second current source coupled in parallel to the first current source, wherein the second current source is configured to provide current to the first current source responsive to a control signal.

19. The system of claim 18, wherein the control signal indicates the change in the voltage provided by the voltage source.

20. The system of claim 19, wherein the slew detector includes a capacitor coupled to the voltage source.

* * * * *